United States Patent
Barna et al.

(10) Patent No.: US 6,861,637 B2
(45) Date of Patent: Mar. 1, 2005

(54) PROVIDING CURRENT TO COMPENSATE FOR SPURIOUS CURRENT WHILE RECEIVING SIGNALS THROUGH A LINE

(75) Inventors: Sandor L. Barna, Pasadena, CA (US); Giuseppe Rossi, Pasadena, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/689,612

(22) Filed: Oct. 22, 2003

(65) Prior Publication Data

US 2004/0079973 A1 Apr. 29, 2004

Related U.S. Application Data

(62) Division of application No. 10/216,248, filed on Aug. 12, 2002.

(51) Int. Cl.[7] ............................................. H01L 27/00
(52) U.S. Cl. ................................. 250/208.1; 250/214 C
(58) Field of Search ......................... 250/214 R, 208.1, 250/214 C; 257/291, 292, 443, 445

(56) References Cited

U.S. PATENT DOCUMENTS

| | | |
|---|---|---|
| 4,380,741 A | 4/1983 | Mazgy |
| 4,558,366 A | 12/1985 | Nagumo |
| 4,891,606 A | 1/1990 | Clark, II et al. |
| 5,168,153 A | 12/1992 | Ikeda |
| 5,315,413 A | 5/1994 | Yamamoto et al. |
| 5,909,026 A | 6/1999 | Zhou et al. |
| 5,949,483 A | 9/1999 | Fossum et al. |
| 6,204,524 B1 | 3/2001 | Rhodes |
| 6,229,134 B1 | 5/2001 | Ang et al. |
| 6,295,013 B1 | 9/2001 | Barna et al. |
| 6,365,950 B1 | 4/2002 | Sohn |
| 6,373,050 B1 | 4/2002 | Pain et al. |
| 6,410,899 B1 | 6/2002 | Merrill et al. |

FOREIGN PATENT DOCUMENTS

WO     WO 02/32114 A1 *   4/2004

* cited by examiner

Primary Examiner—Que T. Le
(74) Attorney, Agent, or Firm—Dickstein Shapiro Morin & Oshinsky LLP

(57) ABSTRACT

Circuits, methods, and systems are disclosed in which a current is provided to compensate for spurious current while receiving signals through a line. For example, the spurious current can be sensed and the compensating current can be approximately equal to the sensed spurious current. The spurious current could include photocurrent from a bright light, and the compensating current can prevent bright light effects.

11 Claims, 6 Drawing Sheets

PROVIDING CURRENT TO COMPENSATE FOR SPURIOUS CURRENT WHILE RECEIVING SIGNALS THROUGH A LINE

This application is a divisional of application Ser. No. 10/216,248, filed Aug. 12, 2002, the entire disclosure of which is incorporated herein by reference.

FIELD OF THE INVENTION

The invention relates to techniques for receiving signals from signal-providing elements through a line. Particularly, the invention relates to methods, circuits, and systems that provide current to compensate for spurious current while receiving signals through such a line.

BACKGROUND OF THE INVENTION

Various types of elements for providing signals through a line in various configurations are known. For example, U.S. Pat. No. 6,204,524 ('524), incorporated herein by reference, describes CMOS active pixel sensor (APS) arrays and compares them to other semiconductor-based imagers, including charge coupled devices (CCDs), photodiode arrays, charge injection devices, and hybrid focal plane arrays.

In many known configurations, a number of light sensing elements, often called "pixels", provide their signals through a conductive line, sometimes referred to herein as a "readout line". In a row/column array, for example, each column typically has a readout line to receive signals from a group of pixels that includes one pixel from each row; when a row is selected, each pixel in the row can provide its signal through its column's readout line. As used herein, in a row/column array, a "row" is defined as a line of pixels or other signal-providing elements that can be concurrently selected for readout, while a "column" is defined as a line of pixels that provide their signals through a shared readout line, also referred to as a "column line".

FIG. 1 shows circuit 100, which exemplifies features of a conventional CMOS APS array as exemplified in '524. Circuit 100 can be implemented as integrated circuitry on a chip. Pixel array 110 is a row/column array with M rows and N columns of pixels. As illustrated, pixel 112 is in one of the rows and one of the columns; while its row is selected, pixel 112 can provide signals through line 114, the readout line for its column.

Within pixel 112, photo-generated charge converted from photons of radiant energy is transferred to region 120, and can be amplified during transfer. Region 120, also referred to as a floating diffusion region, is in turn connected to provide a signal to the gate of source follower transistor 122 indicating a quantity of charge in region 120. Source follower transistor 122 converts the gate signal to a pixel output voltage. When Row switch 124, which can also be a transistor, is closed by a row select signal, the pixel output voltage results in a signal to readout circuitry 130 through line 114.

Within readout circuitry 130, sample and hold (S/H) circuit 132 includes load transistor 134 biased by voltage VLN to provide a bias current of appropriate magnitude for source follower transistor 122 through line 114. During sampling, S/H transistor 136 can be turned on and, in response to the pixel output voltage from source follower transistor 122, S/H capacitance 138 stores a voltage representing the amount of charge in diffusion region 120. The voltage stored by S/H capacitance 138 can then be used to provide a signal to readout path 140 for further processing.

In a typical implementation, S/H circuit 132 for line 114 includes two separately switched S/H capacitances, one for signal sampling and one for reset sampling, as shown in '524.

In circuit 100 and other circuits, problems can be caused by undesired currents, such as photocurrents, that affect signals provided through lines. The term "spurious current" is used herein to mean any current on a line that, although not a genuine bias current, affects a signal provided by a pixel or other signal-providing element through the line.

Although spurious current could result from various undesired processes, it is especially problematic in a CMOS image sensor implemented in silicon. In a CMOS image sensor, some photoelectrons generated by silicon are not captured by the photodiode or other photosensitive region of any pixel. Instead, such photoelectrons can produce an undesired photocurrent on certain other nodes in the pixel circuitry. In particular, a very bright object can cause a significant photocurrent at the row select transistors of many pixels in a column.

In circuit 100 in FIG. 1, for example, bright light can cause photocurrent to flow from line 114 through a parasitic diode at the open Row switch of pixel 112. As a result, the performance of source follower transistor 122 may be affected.

The main effect of photocurrent from bright light involves bias current provided by load transistor 134. The bias current is modified by photocurrent in the Row select switches of pixel 112 and of other pixels in the same column; the photocurrents may, in combination, be comparable to the bias current. Therefore, when a pixel's Row switch is closed, enabling its source follower to provide a signal through line 114, the source follower's operation may be affected by the modified bias current. If the photocurrents increase the bias current, the source follower may saturate at a lower threshold, and if the photocurrents are sufficiently large, the source follower gain can be substantially reduced. Illustratively, if a pixel normally provides a signal from 0 to 1 volt, its signal might reach a maximum at 0.6 or 0.7 volts instead of 1 volt. Also, gain may be reduced for all pixels in a column. Therefore, the column's readout circuitry may receive reduced signals for all pixels in the column, forming a vertical line in an image read out from the array.

Vertical lines and other effects resulting from intense illumination of pixels in a row/column array or other configuration are referred to herein as "bright light effects". As used herein, "light" includes all wavelengths of electromagnetic radiation, and the term "bright light" is used herein to encompass any source of electromagnetic radiation at sufficient intensity to produce a bright light effect, regardless of the radiation's wavelength distribution. An extended bright light effect such as a vertical line, if produced by an image of the sun, may be called "sun smear".

In addition to row/column arrays, the spurious current problem can also arise in other arrays and configurations in which light sensing pixels or other signal-providing elements provide signals through readout lines.

The invention provides techniques that alleviate the spurious current problem.

BRIEF SUMMARY OF THE INVENTION

The invention provides circuits, methods, and systems in which a current is provided to compensate for spurious current while receiving signals through a line. For example, the spurious current can be sensed and the compensating current can be approximately equal to the sensed spurious current. The spurious current could include photocurrent from a bright light, and the compensating current can prevent bright light effects.

BRIEF DESCRIPTION OF THE DRAWINGS

Additional advantages and features of the invention will be apparent from the following detailed description and drawings.

DETAILED DESCRIPTION OF THE INVENTION

The following detailed description refers to the accompanying drawings, which form a part hereof and which show by way of illustration specific implementations of the invention. These implementations are described in sufficient detail to enable those skilled in the art to practice the invention, and it is to be understood that other implementations may be utilized and that structural, logical, and electrical changes may be made without departing from the spirit and scope of the invention. The following detailed description is, therefore, not to be taken in a limiting sense, and the claims indicate the scope of protection sought.

Figure 1:
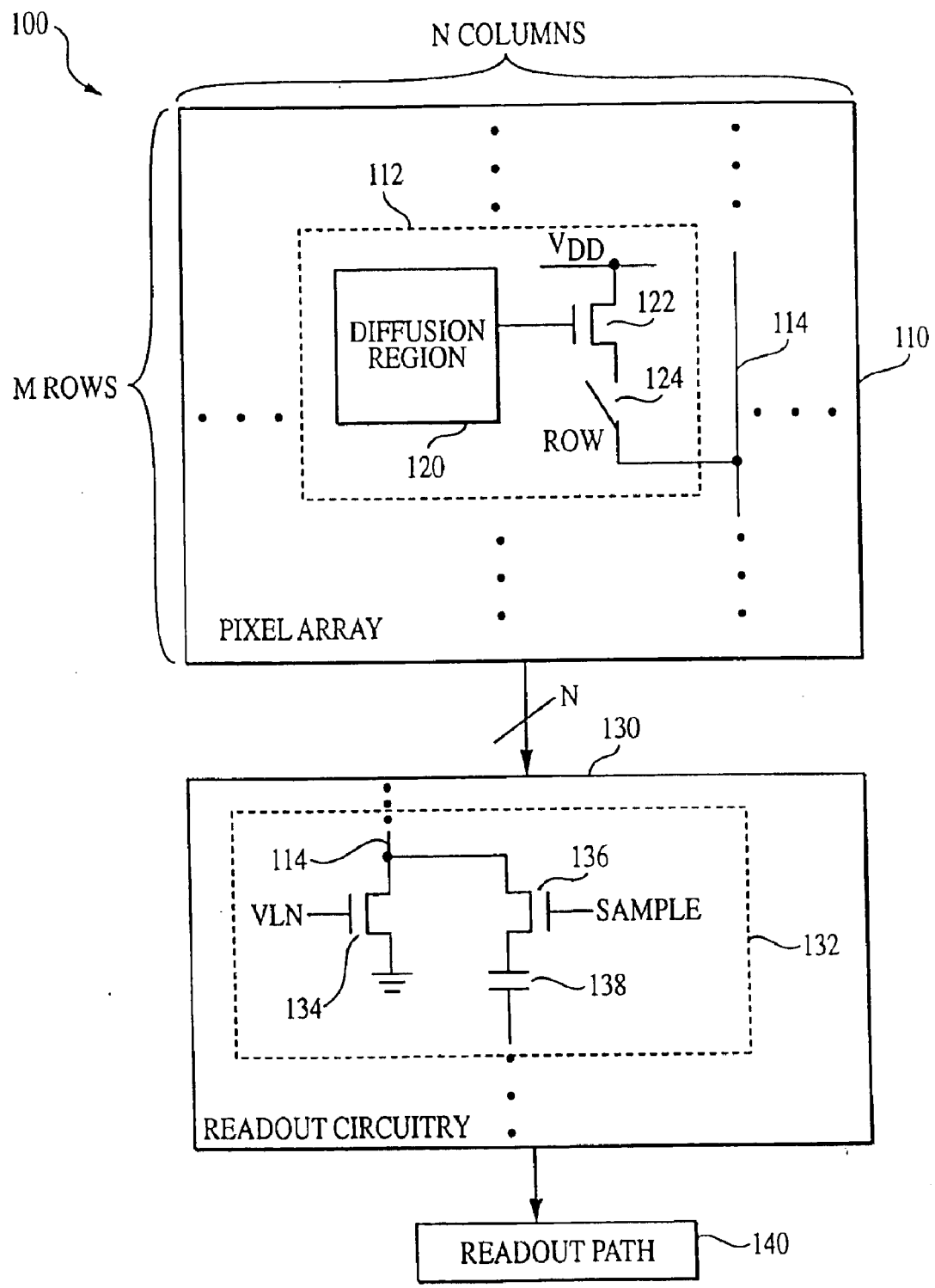
FIG. 1 is a schematic circuit diagram showing conventional CMOS circuitry in which light sensing pixels provide signals through readout lines.
Figure 2:
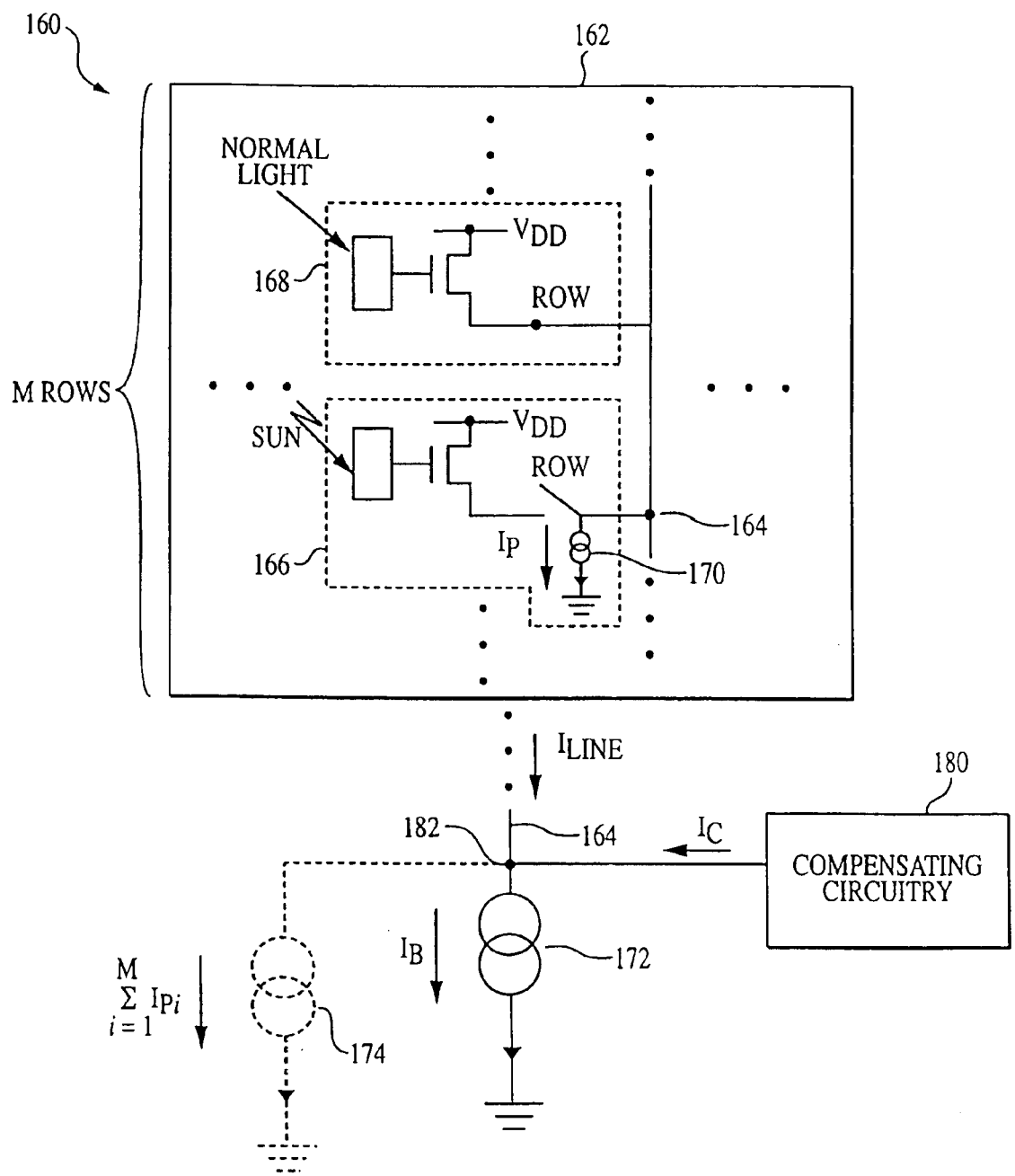
FIG. 2 is a schematic circuit diagram illustrating how current can compensate for spurious current in a circuit like that of FIG. 1.

FIG. 2 shows circuit 160 with array 162, illustratively a row/column image sensing array similar to array 110 in FIG. 1. The invention is also applicable, however, to other arrays and configurations in which light sensing pixels or other signal-providing elements provide signals on readout lines on which spurious current can occur.

Within array 162, light sensing pixels 166 and 168 are connected for providing signals through column line 164. Like pixel 112 in FIG. 1, each pixel includes a source follower transistor and a row select transistor, illustratively shown as a Row switch. For purposes of illustration, pixel 166 is receiving a bright light, such as at the center of a direct image of the sun, while pixel 168 is receiving normal image light.

The bright light causes photocurrent $I_P$ to flow from line 164 through the parasitic diode of the open Row switch of pixel 166, as indicated by photocurrent sink 170. At the same time, bias current sink 172 draws bias current $I_B$ from line 164, so that the total current being drawn from line 164 is $I_B+I_{Pi}$ for I=1 through M. In this case, spurious current includes $I_{Pi}$, represented by combined spurious current sink 174 in parallel with bias current sink 172. Spurious current sink 174 is shown in dashed lines to emphasize that it is only illustrative, merely representing a combination of photocurrents that include $I_P$ through photocurrent sink 170. As noted above, a very bright object can cause significant photocurrent at the select transistors of many pixels connected to line 164, so that $I_{Pi}$ may be much larger than $I_{Pi}$ of any single pixel.

The Row switch of pixel 168 is closed to enable its source follower to provide a signal through line 164 indicating its pixel output voltage. The bias current of the source follower is $I_B+I_{Pi}$ rather than $I_B$, so that its operating range or its gain may be substantially reduced in the manner described above, producing a bright light effect such as a vertical line in an image read out from array 162.

FIG. 2 also shows a way to compensate for spurious current such as $I_{Pi}$, alleviating the spurious current problem. In circuit 160, compensating circuitry 180 provides compensating current $I_C$ to line 164. By taking a current sum at node 182, it can be seen that $I_{LINE}$, the total current on line 164 into node 182, must equal the combination of the other currents, i.e. $I_{LINE}=I_B+I_{Pi}-I_C$. In the ideal case for bias of the source followers, $I_{LINE}=I_B$ which can only hold if $I_{Pi}=I_C$. Therefore, a current compensating for spurious current should be at least approximately equal to the spurious current, and ideally the two would be precisely equal.

As used herein, the term "compensate", as in "compensating for spurious current", means to make up for the thing compensated. In other words, a "compensating current" can make up for spurious current, such as by supplying a current with matching or approximately equal magnitude to a line from which spurious current is being drawn. Conversely, if a spurious current were being supplied to a line, a compensating current could be drawn from the line.

The compensation technique in FIG. 2 is applicable not only to the illustrated type of spurious current nor only to the particular signal-providing circuitry shown for pixels 166 and 168, but could be applied in general to lines through which any type of signal-providing elements provide signals that may be affected by any type of spurious currents. Further, the positioning of compensating circuitry 180 relative to array 162 and current sink 172, although convenient, is merely illustrative, and compensating current $I_C$ could be provided to line 164 at any suitable point along its length.

Figure 3:
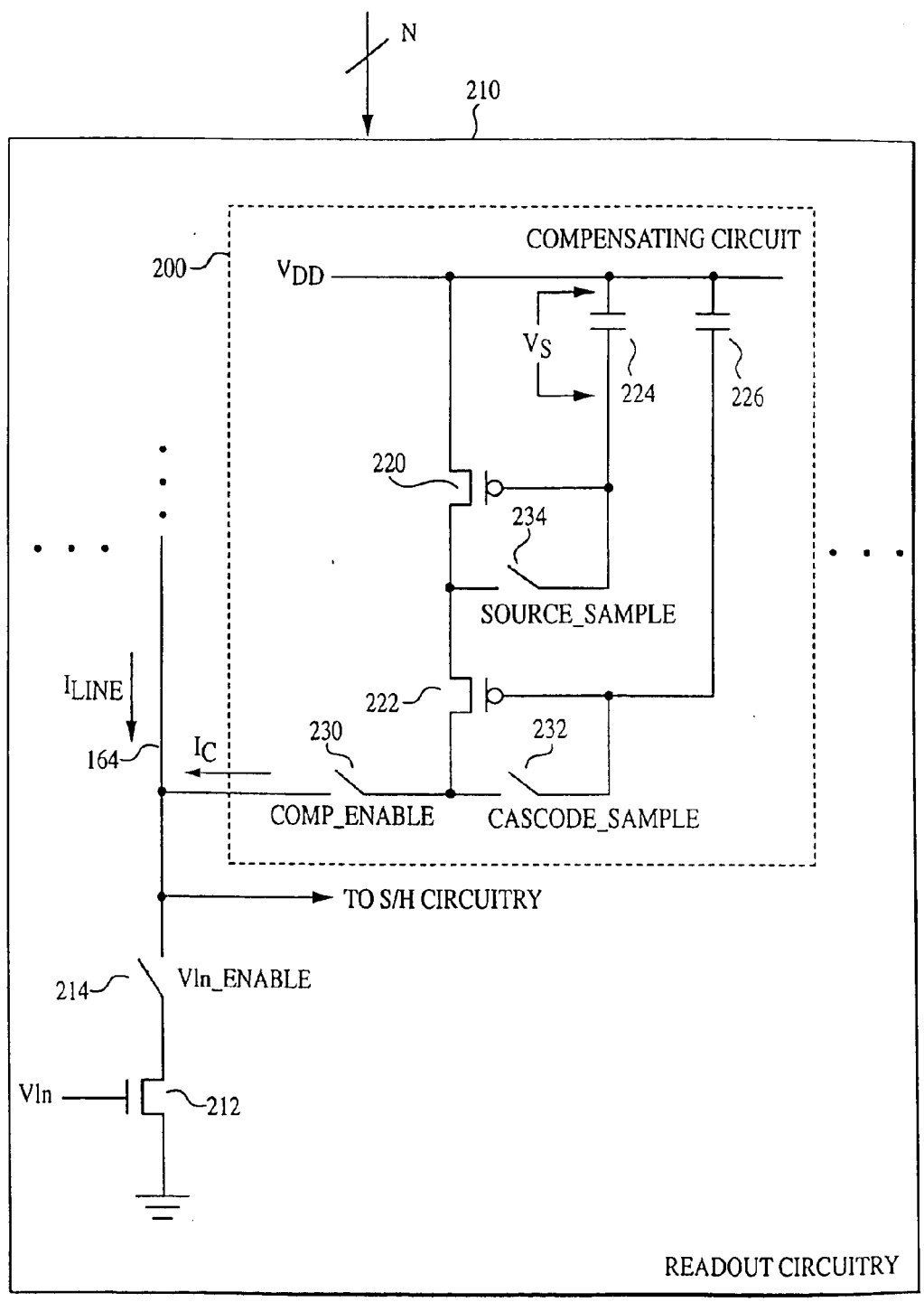
FIG. 3 is a schematic circuit diagram of a compensating circuit that senses spurious current in a readout line and provides a compensating current on the readout line that matches the sensed spurious current.

FIG. 3 shows circuit 200, an example of how compensating circuitry 180 in FIG. 2 can be implemented. Circuit 200 can provide compensating current $I_C$ on line 164 while a signal is provided, and therefore can prevent or eliminate bright light effects such as sun smear and other effects due to spurious current. Specifically, circuit 200 can sense spurious current on readout line 164 when pixels are not providing signals through line 164 and can provide a current to compensate for the spurious current to line 164 while a pixel is providing its signal through line 164. Advantageously, circuit 200 provides compensating current that is equal to the readout line's sensed spurious current to a high level of precision. In addition, circuit 200 includes a cascoded transistor current source that provides a constant current that is very insensitive to variations in voltage on line 164, such as during signal and reset sampling.

Compensating circuit 200 can conveniently be included in readout circuitry 210 for an array, connected near the point at which S/H circuitry is connected as shown, but could alternatively be connected to line 164 in any other appropriate position. Readout circuitry 210 also includes an implementation of current sink 172 in FIG. 2, which includes transistor 212, held on by voltage V1n, and V1n_ enable switch 214.

Although highly suitable for a CMOS image sensor as described above, compensating circuit 200 could be applied in any other device in which signals provided on a line are affected by spurious current as defined above. Because it can remove or eliminate bright light effects such as sun smear, circuit 200 is especially useful in outdoor daylight situations.

As noted above, cascoded transistors 220 and 222, p-channel transistors in this implementation, provide a current source for circuit 200. As used herein, the term "cascoded transistors" encompasses a configuration of two or more transistors connected in series and with one controlling the output voltage of the next in the series. Circuit 200 also includes sensing capacitors 224 and 226, connected between supply voltage $V_{DD}$ and the gates of transistors 220 and 222, respectively. As used herein, "sensing", as in "sensing spurious current", means to obtain one or more signals that indicate or include information about a parameter of the thing sensed, such as the magnitude or another value of a sensed current. Capacitors 224 and 226 obtain signals in the form of voltage levels that cause transistors 220 and 222 to provide a compensating current equal in magnitude to a spurious current; the voltage levels therefore indicate or include information about the spurious current's magnitude.

Figure 4:
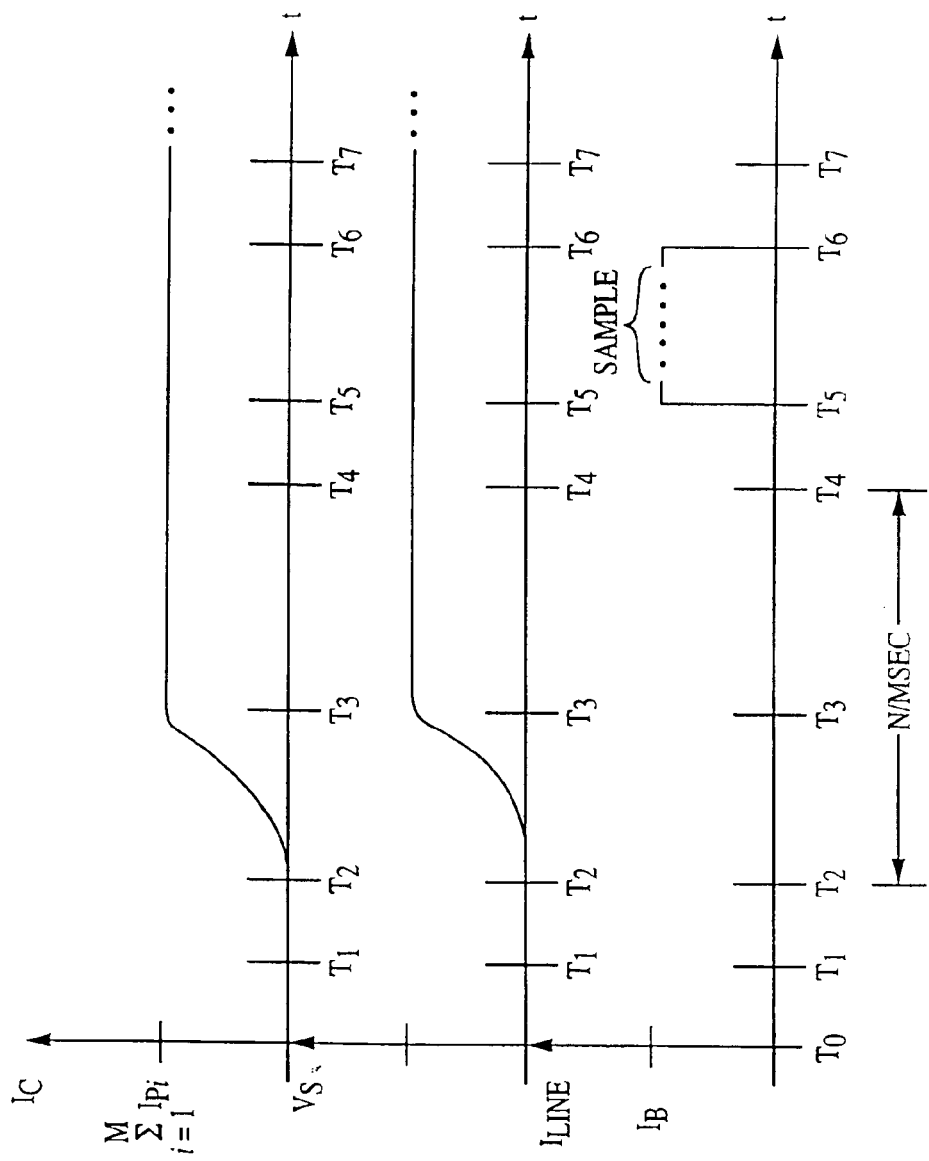
FIG. 4 is a timing diagram showing waveforms that occur in the compensating circuit of FIG. 3.

Several switches control compensating circuit 200, as can be understood more fully in relation to FIG. 4. For example, at $T_0$ in FIG. 4, Comp_enable switch 230 can be closed, enabling circuit 200 to begin sensing and compensating for spurious current on line 164. Similarly, Comp_enable switch 230 can be opened to stop these operations.

$T_1$ marks the beginning of a row's sampling cycle, during which signal and reset sampling can be performed in the conventional manner. The remainder of FIG. 4 shows events during the cycle that begins at $T_1$, and the same or similar event sequences could occur during subsequent cycles.

At $T_2$, Cascode_sample switch 232 and Source_sample switch 234 are closed. Assuming Comp_enable switch 230 is closed, the closing of Cascode_sample switch 232 and Source_sample switch 234 places circuit 200 in a sensing mode in which it senses spurious current on line 164. Switches 232 and 234 begin the sensing mode by providing a connection between each transistor's gate and one of its channel leads, allowing the voltages on the gates to float to levels at which transistors 220 and 222 are providing a current that balances spurious current.

At $T_2$, the Row switches of all pixels connected to line 164 are open, and V1n_enable switch 214 is also open. As a result, the only current sinks connected to line 164 are spurious current sinks such as those represented by spurious current sink 174 in FIG. 2 and the only current source connected to line 164 is cascoded transistors 220 and 222. Transistors 220 and 222 are turned off at $T_1$ by supply voltage $V_{DD}$ received through capacitors 224 and 226, but are then turned on at $T_2$ by closing switches 232 and 234. As discussed above, the photocurrent sinks represented by spurious current sink 174 can provide a spurious current of $I_{Pi}$, and, after an initial transient, cascoded transistors 220 and 222 provide a precisely matching current $I_C=I_{Pi}$, as shown in the upper waveform in FIG. 4.

While cascoded transistors 220 and 222 go through the initial transient to providing $I_C=I_{Pi}$, the voltages at their gates also go through a transient, as illustrated by the second waveform in FIG. 4, showing the voltage $V_S$ across capacitor 224, which is equal to $V_{DD}$ minus the gate voltage of transistor 220. This transient ends when $V_S$ and the voltage across capacitor 226 (not shown) reach levels at which transistors 220 and 222 provide $I_C=I_{Pi}$, shown at $T_3$ in FIG. 4. At $T_3$, spurious current $I_{Pi}$ has been sensed, and values for producing $I_C=I_{Pi}$ are stored in capacitors 224 and 226.

At $T_4$, which could for example be approximately 1 μsec after $T_2$, switches 232 and 234 are opened, shifting circuit 200 from the sensing mode to an operating mode in which it provides $I_C=I_{Pi}$, precisely compensating for spurious current on line 164; the operating mode can continue until circuit 200 is shifted back into the sensing mode, or as long as capacitors 224 and 226 are storing accurate voltages. At T5, switch 214 is closed so that $I_{LINE}$, the net current in line 164, rises to the appropriate bias current $I_B$ for source followers to provide signals through line 164. Further switching can then be performed in the conventional manner to close the Row switch of a pixel whose source follower is providing a signal in the current row cycle, and to capture the signal in S/H circuitry without any effect from undesired photocurrent or other spurious current. Despite fluctuating voltages and signals on line 164 during sampling, circuit 200 continues to provide constant compensating current $I_C=I_{Pi}$ because transistor 232 is isolated from voltage on line 164 due to the cascoded connection with transistor 234, which acts as a buffer. In a typical implementation, signals will be received by voltage mode read out, but other readout techniques could be used within the scope of the invention.

When sampling is completed, switch 214 opens at T6 and $I_{LINE}$ drops back to zero because circuit 200 continues to compensate for spurious current on line 164. The row cycle ends and a following row cycle begins at T7, with circuit 200 continuing to harmlessly provide $I_C=I_{Pi}$ until switches 232 and 234 are again closed to begin the next sensing phase. Although capacitors 224 and 226, which control the level of compensating current $I_C$, discharge very slowly through parasitic resistances of sampling switches 232 and 234, parasitic effects in typical implementations should be small enough to make this effect negligible over time scales of interest, so that $V_S$, and therefore $I_C$, can be treated as remaining constant until well after the following row's cycle begins. Also, sampling switches 232 and 234 can be CMOS switches to reduce the effect of clock feedthrough and charge injection on sensing of spurious current.

Each row's cycle can begin with spurious current sensing by circuit 200, as occurs between $T_2$ and $T_4$ in FIG. 4, to ensure that any spurious current changes, such as photocurrent variations due to image changes, are reflected in the voltages across capacitors 224 and 226. This also ensures that capacitors 224 and 226 do not discharge appreciably from the values necessary to compensate for spurious current, and are updated during each row's cycle by an upward or downward transient similar in duration to the one between $T_2$ and $T_3$ in FIG. 4.

Circuit 200 is particularly advantageous because it senses spurious current and provides precisely matching compensating current. Although it would be within the scope of the invention to compensate for spurious current less precisely, circuit 200 can achieve precise matching because cascoded transistors 220 and 222 provide a self-biasing, highly constant current source that is not sensitive to voltage variations on line 164.

Compensating circuitry 180 in FIG. 2 could be implemented in numerous ways other than circuit 200. Various other types of current sources could be used, such as single transistor sources, sources with transistors connected in a mirror or other configuration, and so forth. Capacitors 224 and 226 are illustrative only, and could be replaced by any appropriate component for holding a voltage or other sensed value indicating a spurious current, including any suitable configuration of capacitors or equivalents. The sequence of operations in FIG. 4 could also be modified within the scope of the invention, such as by sensing spurious current more or less frequently relative to sampling or by adding additional modes besides the sensing and operating modes of circuit 200.

The compensating technique exemplified by circuit 200 could readily be applied in other environments, such as by drawing a compensating current from each readout line in an inverted or n-type circuit in which spurious currents flow into readout lines rather than out from readout lines as in the more conventional p-type circuits in FIGS. 2 and 3. Although the illustrated implementation is highly suitable for sensing visible light images with a CMOS image sensor array, application to sensing of any other images in visible or invisible regions of the radiation spectrum or to sensing of other input energy sources would be within the scope of the invention. Examples of other possible applications include infrared, ultraviolet, and x-ray image sensing, and bright lights causing spurious current could be within or outside the sensing region of the spectrum.

As suggested in FIG. 3, readout circuitry 210 can include an array of N circuits like circuit 200, each connected to a column line from an image sensor array. As in FIG. 1, output from readout circuitry 210 can be provided to a suitable readout path.

Although particularly suited for integration on a substrate with a CMOS image sensor array as described below, transistors, capacitances, and switches as in FIG. 3 could be implemented with any appropriate structures, including transistors, capacitors, and switching transistors of any suitable type formed with layers of semiconductor material on any appropriate substrate. The invention could be implemented, for example, on a GaAs substrate in which spurious currents arise due to leakage, or in other contexts in which spurious currents arise. Other possible implementations within the scope of the invention include, but are not limited to, silicon-on-insulator (SOI) technology, silicon-on-sapphire (SOS) technology, doped and undoped semiconductors, epitaxial layers of silicon supported by a base semiconductor foundation, and other semiconductor structures. Implementation with an absorption medium on a separate chip, connected for example by a Ge or GaAs flip chip connection, would also be within the scope of the invention.

Figure 5:
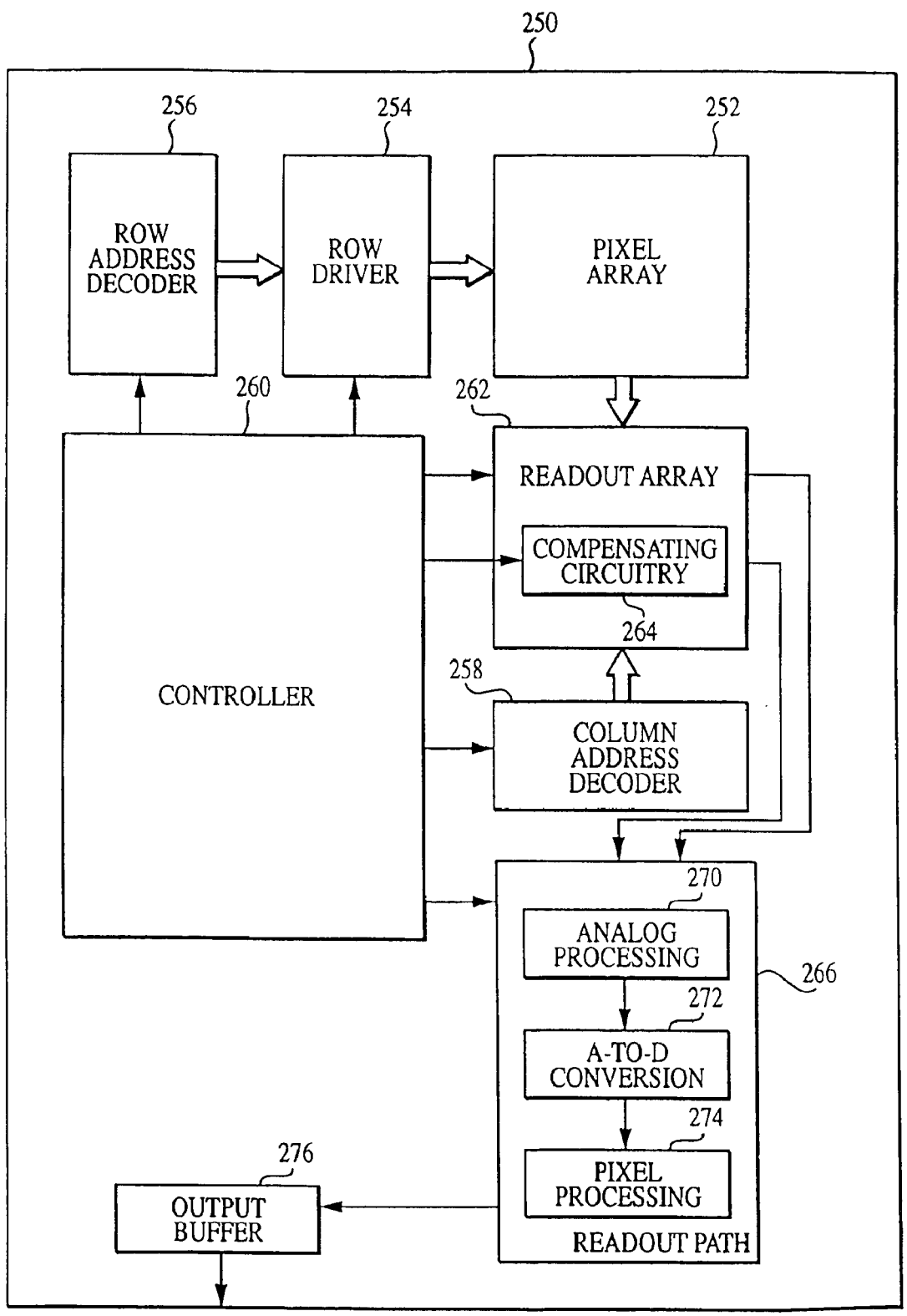
FIG. 5 is a schematic block diagram showing components on a chip, including compensating circuitry.

FIG. 5 shows chip 250 on which readout circuitry as in FIG. 3 can be implemented as part of an integrated image sensor circuit. Pixel array 252 can be implemented as a CMOS image array as described in U.S. Pat. No. 6,204,524 ('524), incorporated by reference. Row driver 254, row address decoder 256, and column address decoder 258, can also be implemented as described in '524. Controller 260, which can be a block of digital logic that functions as a state machine providing timing and control signals to other components, can in part provide timing and control signals as described in '524, though it also provides other signals as described below.

Readout array 262 can be implemented as described above in relation to FIGS. 1 and 3. Within readout array 262, compensating circuitry 264 can be implemented with an array of circuits like circuit 200 in FIG. 3. Column address decoder 258 performs N:1 multiplexing to transfer a sequence of signals from readout array 262 to readout path 266, which can include analog processing circuitry 270, analog-to-digital (A-to-D) conversion circuitry 272, and pixel processing circuitry 274. Pixel processing circuitry 274 can receive digital values, correct defective pixels, and perform color interpolation and other digital image processing. Pixel processing circuitry 274 and controller 260 could both be implemented on a simple microprocessor on chip 250. Signals from chip 250 are ultimately transferred from output buffer 276 to an external computer system or other external circuitry, such as through appropriate pin connections.

Controller 260 provides signals to switches in readout array 262, including switches in compensating circuitry 264.

If implemented with circuit 200, controller 260 can provide signals to close and open switches as described above in relation to FIG. 4.

A chip with circuitry to compensate for spurious current could be implemented in many other ways within the scope of the invention. Also, rather than being on a single chip, some circuitry, such as the readout array and readout path, could be provided on one or more additional chips rather than on the same chip with the pixel array, all within the scope of the invention.

Figure 6:
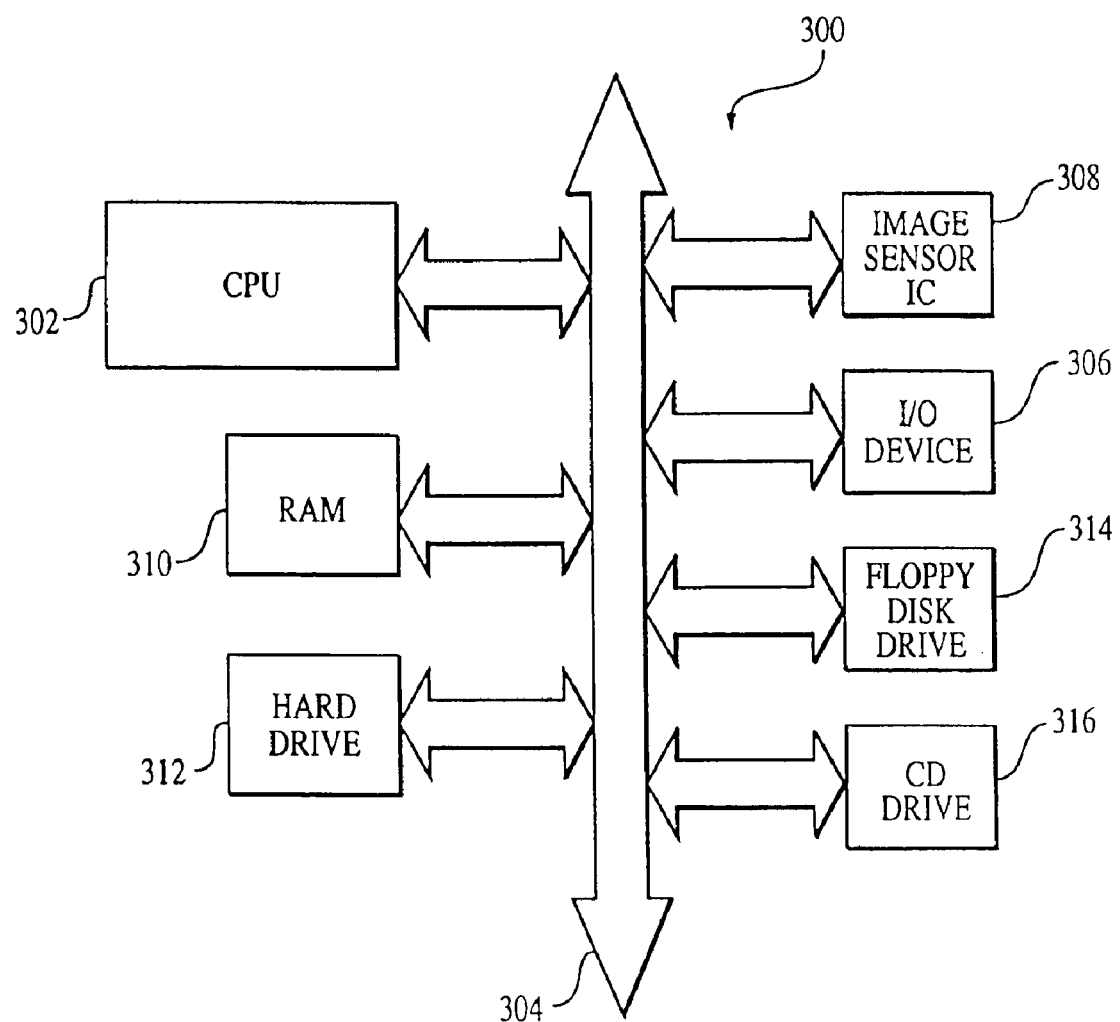
FIG. 6 is a schematic block diagram of a system that includes a sensor chip with compensating circuitry.

FIG. 6 shows system 300, a typical processor based system modified to include an image sensor IC as in FIG. 5. Processor based systems exemplify systems of digital circuits that could include an image sensor. Examples of processor based systems include, without limitation, computer systems, camera systems, scanners, machine vision systems, vehicle navigation systems, video telephones, surveillance systems, auto focus systems, star tracker systems, motion detection systems, image stabilization systems, and data compression systems for high-definition television, any of which could utilize the invention.

System 300 includes central processing unit (CPU) 302 that communicates with various devices over bus 304. Some of the devices connected to bus 304 provide communication into and out of system 300, illustratively including input/output (I/O) device 306 and image sensor IC 308. Other devices connected to bus 304 provide memory, illustratively including random access memory (RAM) 310, hard drive 312, and one or more peripheral memory devices such as floppy disk drive 314 and compact disk (CD) drive 316.

Image sensor 308 can be implemented as an integrated image sensor circuit on a chip with circuitry to compensate for spurious current, as illustrated in FIG. 5. Image sensor 308 may be combined with a processor, such as a CPU, digital signal processor, or microprocessor, in a single integrated circuit.

As can be seen by the described implementations, the invention encompasses methods, circuits, and systems that provide current to compensate for spurious current, such as, e.g., spurious current occurring on a column line during sampling of a CMOS image array.

Although the invention has been described with specific reference to row/column arrays for image sensing, the invention has broader applicability and may be used in any application where signals from signal-providing elements may be affected by spurious current. Also, although exemplary compensating circuitry has been described and illustrated, current to compensate for spurious current could be provided in many other ways, some of which are mentioned above. Accordingly, the methods described above are merely exemplary.

The above description and drawings illustrate implementations that achieve the objects, features, and advantages of the invention, but it is not intended that the invention be limited to any illustrated or described embodiment. Any modification that comes within the spirit and scope of the following claims should be considered part of the invention.

What is claimed as new and desired to be protected by Letters Patent of the United States is:

1. A method of receiving signals from an imaging integrated circuit with image signal-providing elements that provide image signals through a line; the method comprising:

receiving light, including bright light, on the imaging integrated circuit, the bright light causing photocurrent in the line from a selected one of said signal-providing elements, said photocurrent sufficient to produce a bright light effect in a resulting image; and while said selected one of the signal-providing elements is providing a signal through the line, providing current to compensate for the photocurrent on the line.

2. The method of claim 1, further comprising:

when none of the signal-providing elements is selected and providing a signal through the line, sensing spurious current on the line; the sensed spurious current including the photocurrent caused by the receiving of said bright light;

the compensating current being approximately equal to the sensed spurious current.

3. A method of receiving signals from light sensing pixels in an image sensor, the pixels providing signals to a plurality of conductive lines of said image sensor in response to bias current on the conductive lines; the method comprising:

providing source-follower transistor bias current on each of said plurality of conductive lines, each conductive line receiving signals from one of the pixels via the conductive line; and providing compensating current to compensate for spurious bias current on each of said plurality of conductive lines.

4. The method of claim 3 in which the spurious bias current is photocurrent.

5. The method of claim 3, further comprising, for each of said plurality of conductive lines:

when none of the pixels is providing a signal through the conductive line, sensing the spurious bias current on the conductive line;

the compensating current being approximately equal to the sensed spurious bias current.

6. A method of receiving signals from a pixel of an image sensor array, the method comprising:

providing source-follower transistor bias current on a conductive line coupled to said pixel and receiving a signal from said pixel on said conductive line in response to said pixel being exposed to light, the light producing photocurrent on the conductive line; and while receiving the signal from said pixel, providing compensating current to compensate for the photocurrent on the conductive line.

7. The method of claim 6 in which the light produces the photocurrent in switches for connecting source follower transistors of said pixels to the conductive line.

8. A method for operating an image sensor, the method comprising:

reading out a signal from at least one pixel of a pixel array via a column line of said pixel array;

sensing a spurious current value on said column line; and supplying a compensating current to said column line so as to reduce an adverse effect of said spurious current when said at least one pixel is being read out.

9. A method of receiving signals from a row/column array of light sensing pixels in which each column has a readout line; the method comprising:

receiving light on the array, the light including bright light that causes photocurrent in the readout line of a column, the photocurrent being sufficient to produce a bright light effect;

when the pixels are not providing signals through the respective readout lines, sensing spurious current on each readout line; the sensed spurious current including the photocurrent; and while pixels in a row are providing signals through the respective readout lines, providing a compensating current to compensate for spurious current on each readout line, the compensating current for each respective readout line being approximately equal to the respective sensed spurious current, the compensating current preventing the bright light effect.

10. The method of claim 9 in which the bright light is the sun and the bright light effect is sun smear.

11. A method of receiving signals from a row/column array of light sensing pixels; the method comprising:

when the pixels are not providing signals through respective readout lines of the columns, sensing spurious current on each readout line; and while pixels in a row are providing signals through the respective readout lines, providing current to compensate for sensed spurious current on each readout line of the columns, the compensating current for each respective readout line being approximately equal to the respective sensed spurious current.

* * * * *